United States Patent
Ando et al.

(10) Patent No.: US 12,224,383 B2
(45) Date of Patent: Feb. 11, 2025

(54) LIGHT-EMITTING DEVICE AND MANUFACTURING METHOD OF THE SAME

(71) Applicant: STANLEY ELECTRIC CO., LTD., Tokyo (JP)

(72) Inventors: Satoshi Ando, Tokyo-to (JP); Ji-Hao Liang, Tokyo-to (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 475 days.

(21) Appl. No.: 17/675,668

(22) Filed: Feb. 18, 2022

(65) Prior Publication Data
US 2022/0271203 A1 Aug. 25, 2022

(30) Foreign Application Priority Data
Feb. 22, 2021 (JP) .................. 2021-025975

(51) Int. Cl.
*H01L 33/10* (2010.01)
*H01L 33/00* (2010.01)
(Continued)

(52) U.S. Cl.
CPC ........ *H01L 33/505* (2013.01); *H01L 33/0093* (2020.05); *H01L 33/10* (2013.01);
(Continued)

(58) Field of Classification Search
CPC ... H01L 33/505; H01L 33/0093; H01L 33/10; H01L 33/56; H01L 2933/0041; H01L 2933/005
See application file for complete search history.

(56) References Cited

U.S. PATENT DOCUMENTS

| | | | | |
|---|---|---|---|---|
| 7,737,621 B2 * | 6/2010 | Masuda | ............. | C09K 11/7739 313/485 |
| 8,513,872 B2 * | 8/2013 | Annen | ............... | C09K 11/0883 313/501 |
| 9,347,646 B2 * | 5/2016 | Kim | ...................... | H01L 33/504 |

FOREIGN PATENT DOCUMENTS

| JP | 2010283281 A | 12/2010 |
|---|---|---|
| JP | 2013175759 A | 9/2013 |

(Continued)

OTHER PUBLICATIONS

Japanese Office Action (and an English language translation thereof) dated Jul. 2, 2024, issued in counterpart Japanese Application No. 2021-025975.

*Primary Examiner* — David Vu
(74) *Attorney, Agent, or Firm* — Holtz, Holtz & Volek PC

(57) ABSTRACT

A light-emitting device includes a substrate, a frame body, a light-emitting element, a wavelength converter, and a light reflecting portion. The light-emitting element includes a semiconductor light-emitting layer on a support substrate. The wavelength converter is disposed on an upper surface of the light-emitting element. The light reflecting portion covers side surfaces of the light-emitting element and the wavelength converter and is formed of a translucent resin containing light reflective particulate fillers. The light reflecting portion includes a first region extending along an upper surface of the light reflecting portion, a second region that is disposed under the first region and has a content rate of the particulate fillers lower than a content rate of the first region, and a third region that is disposed under the second region and has a content rate of the particulate fillers lower than the content rate of the second region.

9 Claims, 14 Drawing Sheets

(51) Int. Cl.
 *H01L 33/50* (2010.01)
 *H01L 33/56* (2010.01)
(52) U.S. Cl.
 CPC ...... *H01L 33/56* (2013.01); *H01L 2933/0041* (2013.01); *H01L 2933/005* (2013.01)

(56) References Cited

FOREIGN PATENT DOCUMENTS

| | | | |
|---|---|---|---|
| JP | 2014135400 A | 7/2014 | |
| JP | 2015220307 A | 12/2015 | |

\* cited by examiner

LIGHT-EMITTING DEVICE AND MANUFACTURING METHOD OF THE SAME

BACKGROUND OF THE INVENTION

1. Field of the Invention

The present invention relates to a light-emitting device including a light-emitting element and a manufacturing method of the light-emitting device.

2. Background Art

Conventionally, there has been known a light-emitting device that includes a substrate on which conductive patterns such as terminals and wirings are disposed, a light-emitting element having a semiconductor light-emitting layer implemented on the substrate, and a wavelength converter converting a wavelength of light emitted from the light-emitting element.

For example, JP-A-2013-175759 discloses a manufacturing method of a light-emitting device that has a light-emitting element, a translucent member bonded on an upper surface of the light-emitting element, and a first light reflective member and a second light reflective member that are constituted of a resin containing a reflective material such as titanium oxide and formed to cover the side surface of the light-emitting element and the side surface of the translucent member so as to expose the upper surface of the translucent member.

SUMMARY OF THE INVENTION

In the light-emitting element described in JP-A-2013-175759, it is preferred that light does not leak to the outside from the light reflective member by enhancing a light shielding property of the light reflective member. However, trying to increase a concentration of reflective particles so as to enhance the light shielding property of the light reflective member results in making manufacturing difficult or generating a crack easily in the manufactured light reflective member due to decrease of the fluidity of the material of the light reflective member, which is likely to impair reliability.

The present invention has been made in consideration of the problems described above, and an object of the present invention is to provide a light-emitting device and its manufacturing method that can reduce light leakage from an unintended portion while ensuring ease of manufacturing and reliability.

A light-emitting device according to the present invention includes a substrate, a frame body, a light-emitting element, a wavelength converter, and a light reflecting portion. The frame body is disposed on an upper surface of the substrate. The frame body extending along a periphery of the substrate. The light-emitting element includes a support substrate disposed on the substrate and a semiconductor light-emitting layer formed on an upper surface of the support substrate. The wavelength converter is disposed on an upper surface of the light-emitting element. The light reflecting portion covers side surfaces of the light-emitting element and the wavelength converter and is formed of a translucent resin containing light reflective particulate fillers. The light reflecting portion includes a first region extending along an upper surface of the light reflecting portion, a second region that is disposed under the first region and has a content rate of the particulate fillers lower than a content rate of the first region, and a third region that is disposed under the second region and has a content rate of the particulate fillers lower than the content rate of the second region.

A manufacturing method of a light-emitting device includes: preparing a substrate that includes a frame body disposed on an upper surface of the substrate, the frame body extending upward along a periphery of the substrate; bonding a light-emitting element onto the substrate, the light-emitting element including a support substrate and a semiconductor light-emitting layer formed on an upper surface of the support substrate; bonding a wavelength converter on an upper surface of the light-emitting element; injecting and filling a raw material resin made of a precursor of a translucent resin containing light reflective particulate fillers into the frame body so as to cover side surfaces of the light-emitting element and the wavelength converter; spraying particulate bodies formed of a material identical to a material of the particulate fillers from above the raw material resin to deposit the particulate bodies on the raw material resin and impregnating the precursor of the translucent resin between the deposited particulate bodies; partially removing the particulate bodies on a surface by spraying a fluid to the deposited particulate bodies; and curing the precursor of the translucent resin.

BRIEF DESCRIPTION OF THE DRAWINGS

Features of the present invention will be described below with reference to the accompanying drawings.

DETAILED DESCRIPTION OF THE INVENTION

Figure 1:
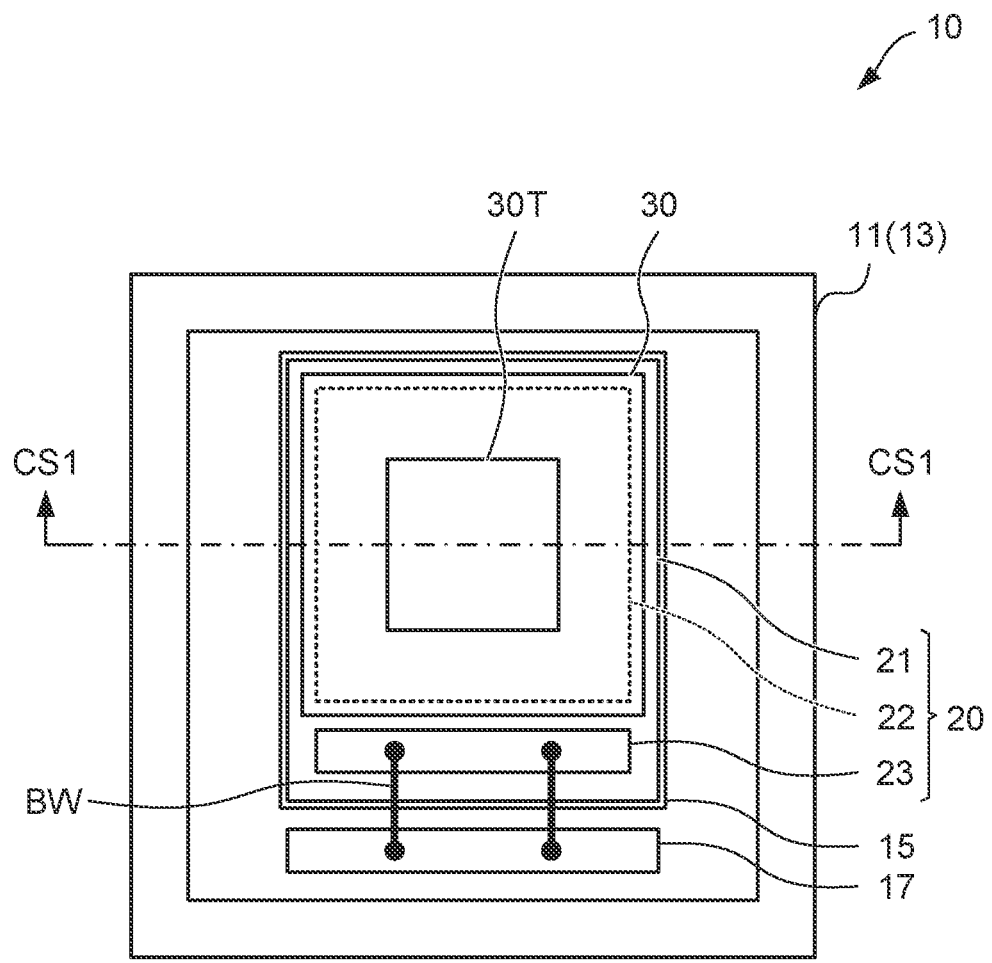
FIG. 1 is a top view of a light-emitting device according to an embodiment of the present invention.

The following describes an embodiment of the present invention in detail. Note that the same reference numerals are given to substantially identical or equivalent parts in the following description and the accompanying drawings.

Figure 2:
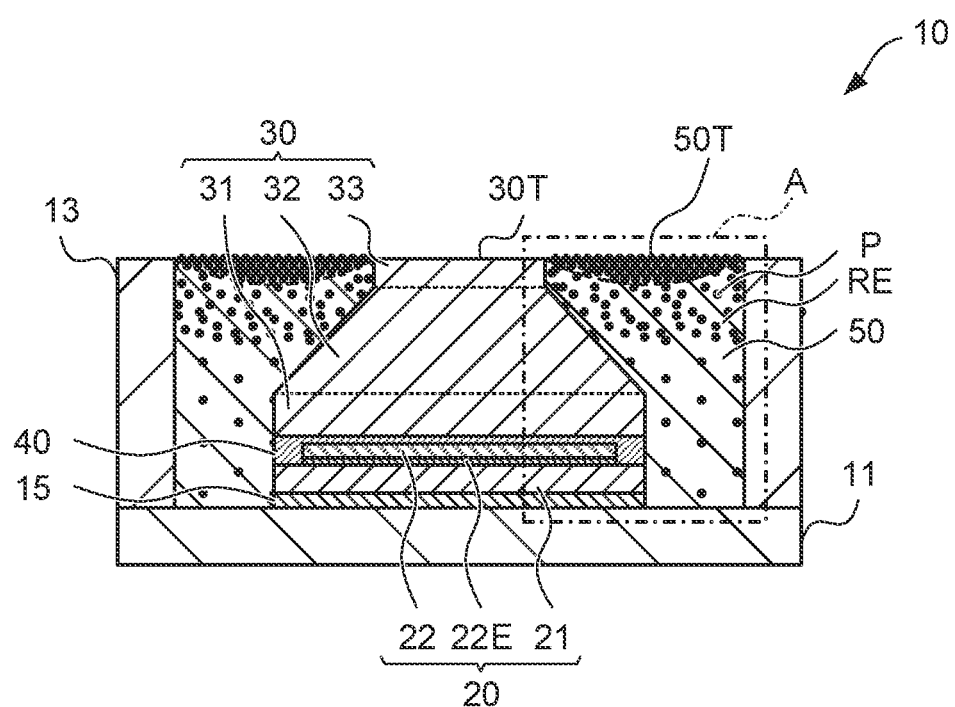
FIG. 2 is a cross-sectional view of the light-emitting device according to the embodiment of the present invention.

With reference to FIGS. 1 and 2, a constitution of a light-emitting device 10 according to the embodiment will be described.

FIG. 1 is a top view of the light-emitting device 10 according to the embodiment. FIG. 2 is a cross-sectional view taken along a line CS1-CS1 of the light-emitting device 10 illustrated in FIG. 1. In FIG. 1, the illustration of a light reflecting portion 50 is omitted in order to illustrate a structure of an inside of the light reflecting portion 50 of the light-emitting device 10.

The light-emitting device 10 has a substrate 11 and a frame body 13 disposed on an outer peripheral portion of an upper surface of the substrate 11. The light-emitting device 10 has a light-emitting element 20 disposed on the upper surface of the substrate 11 and a wavelength converter 30 disposed on an upper surface of the light-emitting element 20. The light-emitting device 10 has the light reflecting portion 50 filled on the upper surface of the substrate 11 and inside the frame body 13 and formed so as to cover side surfaces of the light-emitting element 20 and the wavelength converter 30.

The substrate 11 is, for example, a substrate having a flat plate shape formed of a base material with an insulation property. The substrate 11 is, for example, formed of the base material of aluminum nitride (AlN) or the like with high thermal conductivity. The substrate 11 has a first wiring electrode 15 and a second wiring electrode 17 formed on its upper surface so as to be separated from one another. The first wiring electrode 15 and the second wiring electrode 17 are electrodes made of metal. The first wiring electrode 15 and the second wiring electrode 17 are formed of, for example, metal films having copper (Cu) as a main member that is patterned and formed on the substrate 11. The first wiring electrode 15 functions as an element mounting portion where the light-emitting element 20 is mounted on its upper surface. In a top view, the substrate 11 has through holes (not illustrated) that pass through between the upper surface and the lower surface in each formation region of the first wiring electrode 15 and the second wiring electrode 17. Inside the through hole, for example, a columnar through electrode (not illustrated) having Cu as the main member is formed. Via the through electrodes, each of the first wiring electrode 15 and the second wiring electrode 17 is connected to mounting electrodes (not illustrated) that each function as an anode and a cathode and are each formed on the lower surface of the substrate 11. That is, the substrate 11 has the upper surface, where the first wiring electrode 15 and the second wiring electrode 17 are formed, that functions as an element mounting surface and has the lower surface that functions as a mounting surface to a mounting substrate.

In the embodiment, while a case where the substrate 11 is formed of AlN as the base material is described, the base material of the substrate 11 is not limited to this. For example, the substrate 11 may be formed of a material of ceramic constituted of a metal oxide such as alumina, or zirconia, or a metal nitride such as silicon nitride, or the like. For example, the substrate 11 may be formed of a material where an insulating film is formed on a surface and a through-hole inner wall of a metal, an alloy, or the like as the base material.

The frame body 13 is a frame body having an annular upper surface disposed on the outer peripheral portion of the upper surface of the substrate 11 and formed so as to surround the first wiring electrode 15 and the second wiring electrode 17. The frame body 13 is formed of, for example, AlN that is a material identical to a material of the substrate 11. The substrate 11 forms a concave cavity that opens upward by disposing the frame body 13. Respective components of the light-emitting device 10 indicated below are disposed in the cavity. The frame body 13 may be bonded on the upper surface of the substrate 11 by using an adhesive of resin or the like, or the substrate 11 and the frame body 13 may be integrally formed.

In other words, the light-emitting device 10 has the substrate 11, and the frame body 13 that is disposed on the upper surface of the substrate 11 and extends along the periphery of the substrate 11.

The light-emitting element 20 is a semiconductor light-emitting element having a semiconductor layer 22 including a light-emitting portion stacked on a support substrate 21 that is mounted on the first wiring electrode 15 of the substrate 11 and is formed of, for example, a conductive semiconductor of silicon or the like as the main material. The semiconductor layer 22 is constituted of a structure, for example, where a p-type semiconductor layer, a light-emitting layer, and a n-type semiconductor layer are stacked in this order. An upper surface of the n-type semiconductor layer is an upper surface of the semiconductor layer 22 and functions as a light extraction surface in the light-emitting element 20. In the embodiment, the p-type semiconductor layer, the light-emitting layer, and the n-type semiconductor layer are, for example, a nitride semiconductor made of gallium nitride (GaN) or the like as the main material. The semiconductor layer 22 is a blue light emitting diode (LED) that emits blue-color light from the light-emitting layer having a multiple quantum well structure. In other words, the light-emitting device 10 has the light-emitting element 20 that has the support substrate 21 disposed on the substrate 11 and the semiconductor layer 22 formed on the upper surface of the support substrate 21.

Between the support substrate 21 and the semiconductor layer 22, a light reflection layer 22E is formed. The light reflection layer 22E can improve a light extraction efficiency, from the light extraction surface, which is the upper surface of the semiconductor layer 22, by reflecting the light emitted from the light-emitting layer of the semiconductor layer 22 and return light, from the wavelength converter 30.

In the upper surface of the semiconductor layer 22, micro cones (not illustrated) having an irregularity of approximately 2 to 3 μm are formed. Forming micro cones allows improving the light extraction efficiency, from the semiconductor layer 22.

The support substrate 21 of the light-emitting element 20 is electrically connected to the n-type semiconductor of the semiconductor layer 22, and the lower surface of the light-emitting element 20 functions as a cathode electrode. The cathode electrode, which is the lower surface of the light-emitting element 20 is electrically connected to the first wiring electrode 15 of the substrate 11 via a conductive element bonding layer (not illustrated).

The light-emitting element 20 has an electrode pad 23 formed so as to be separated from the semiconductor layer 22 on the support substrate 21. The electrode pad 23 is electrically connected to the p-type semiconductor of the semiconductor layer 22 and functions as an anode electrode of the light-emitting element 20. The electrode pad 23 is electrically connected to the second wiring electrode 17 of the substrate 11, for example, via conductive bonding wires BW formed of gold (Au).

The wavelength converter 30 is disposed on the semiconductor layer 22 of the light-emitting element 20 via an adhesive resin 40. In top view, the wavelength converter 30 has an outer shape larger than the upper surface shape of the semiconductor layer 22 and is disposed so as to cover the upper surface of the semiconductor layer 22. In the embodiment, the wavelength converter 30 is disposed at a position where a center point of the semiconductor layer 22 and a center point of the wavelength converter 30 in the top view coincide with one another. The wavelength converter 30 performs wavelength conversion to emitted light from the light-emitting element 20. In other words, the light-emitting device 10 has the wavelength converter 30 disposed on the upper surface of the light-emitting element 20.

The wavelength converter 30 is formed of a plate-shaped member containing, for example, phosphor particles made of yttrium aluminum garnet (YAG:$Y_3Al_5O_{12}$) having doped cerium (Ce) as the main material and a binder of glass or ceramic of alumina or the like that transmits radiation light of the light-emitting element 20 and radiation light of the phosphor particles. In the embodiment, the wavelength converter 30 is made of a phosphor plate formed by sintering alumina with which a YAG phosphor is mixed. In the embodiment, the wavelength converter 30 is a wavelength converter that performs the wavelength conversion of a part of the blue light emitted from the light-emitting element 20 to emit white color light.

As illustrated in FIG. 2, the wavelength converter 30 has a shape where a first portion 31 having a wide width, a second portion 32, and a third portion 33 are integrally included from a lower surface side. The first portion 31 has a lower surface opposed to the upper surface of the semiconductor layer 22, extends upward, and is formed in a columnar shape. The second portion 32 is formed in a frustum shape having an inclined side surface that narrows upward from an upper surface end of the first portion 31. The third portion 33 extends upward from an upper surface of the second portion 32, has an upper surface 30T as an upper surface of the wavelength converter 30, and formed in a columnar shape. In other words, the wavelength converter 30 has a bottom surface covering the entire upper surface of the semiconductor layer 22 and the upper surface 30T smaller than the bottom surface and a side surface shape where the width in a direction parallel to the substrate 11 decreases from the bottom surface toward the upper surface 30T.

The wavelength converter 30 has the lower surface connected onto the upper surface of the semiconductor layer 22 via the adhesive resin 40 that transmits the light emitted from the semiconductor layer 22 of the light-emitting element 20. The upper surface 30T faces so as to be exposed to the outside of the light-emitting device 10. That is, the wavelength converter 30 has the lower surface that functions as a light-receiving surface receiving the light emitted by the light-emitting element 20 via the adhesive resin 40 and has the upper surface 30T that functions as the light extraction surface of the light-emitting device 10.

As described above, the wavelength converter 30 is formed such that the upper surface 30T as the light extraction surface has a size smaller than the lower surface as the light incident surface. This allows the wavelength converter 30 to collect the light entering from the lower surface of the wavelength converter 30 to the upper surface 30T to emit high-luminance light.

The adhesive resin 40 as an adhesive resin layer is an adhesive made of a translucent resin material that transmits the light emitted from the light-emitting element 20 and the light emitted from the wavelength converter 30. The adhesive resin 40 is, for example, a thermosetting resin made from a silicone-based resin.

The adhesive resin 40 is formed between the upper surface of the semiconductor layer 22 and the lower surface of the first portion 31 of the wavelength converter 30 and is formed so as to cover the respective surfaces of the upper surface and the side surfaces of the semiconductor layer 22 and the bottom surface of the wavelength converter 30. The adhesive resin 40 fixes the light-emitting element 20 and the wavelength converter 30 by adhering to each of the semiconductor layer 22 and the wavelength converter 30.

The light reflecting portion 50 is formed in the cavity formed by the substrate 11 and the frame body 13 so as to seal the light-emitting element 20 and cover the side surfaces of the wavelength converter 30. The light reflecting portion 50 is a covering member having reflectivity to the light emitted from the light-emitting element 20 and the light emitted from the wavelength converter 30. The light reflecting portion 50 has an upper surface 50T extending from an end of the upper surface 30T of the wavelength converter 30 to an end of an upper surface of the frame body 13. That is, the light reflecting portion 50 is filled in the cavity so as to expose the upper surface 30T as the light extraction surface of the wavelength converter 30.

The light reflecting portion 50 is constituted as, for example, a white resin made of a translucent resin RE containing light scattering particulate fillers P. The particulate fillers P are, for example, particles having light scattering properties such as titanium dioxide ($TiO_2$) particles or the like. The translucent resin RE is, for example, a thermosetting resin having translucency such as silicone resin. In other words, the light-emitting device 10 has the light reflecting portion 50 formed of the translucent resin RE covering the side surfaces of the light-emitting element 20 and the wavelength converter 30 and containing light reflective particulate fillers P. The particulate fillers P are formed of titanium dioxide, and the translucent resin RE is formed of a silicone resin.

The particulate fillers P are, for example, $TiO_2$ particles having a particle size distribution with an average particle diameter of 0.25 μm. By setting the average particle diameter of the particulate fillers P to 0.25 μm, it is possible to efficiently scatter each of the blue light (for example, wavelength 450 nm), the green light (for example, wavelength 555 nm), and the red light (for example, wavelength 600 nm). As the particulate fillers P, it is preferred to use one having the particle size distribution in a range from 0.1 μm to 0.4 μm.

Using FIG. 3, the light reflecting portion 50 will be described in detail.

Figure 3:
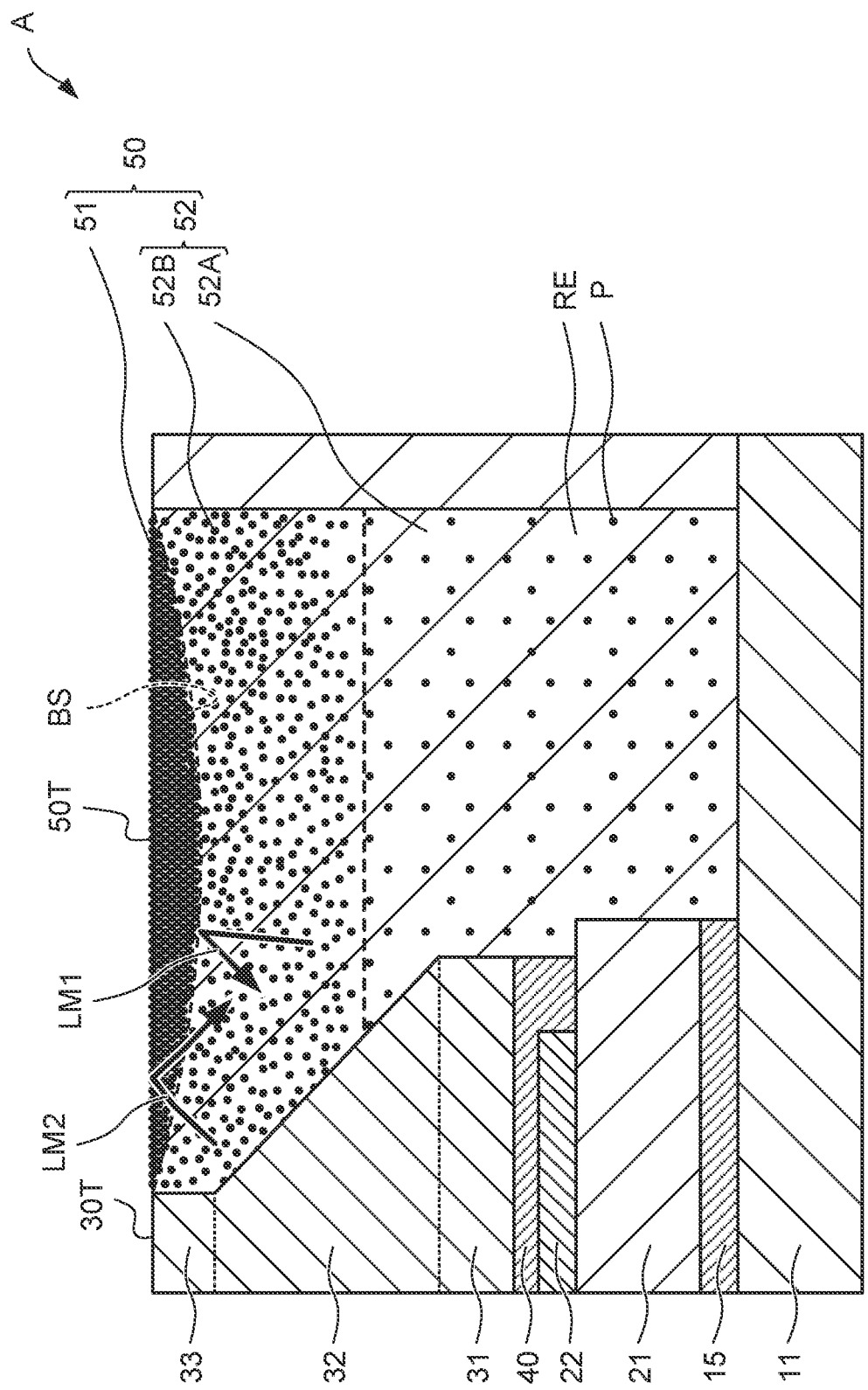
FIG. 3 is an enlarged cross-sectional view enlarging a part A in FIG. 2.

FIG. 3 is an enlarged cross-sectional view of the light reflecting portion 50 indicated by the one-dot chain line area A in FIG. 2.

The light reflecting portion 50 includes a first light reflection layer 51 as a first region extending along the upper surface 50T and a second light reflection layer 52 that is disposed under the first light reflection layer 51 and has a content rate of the particulate fillers P lower than that of the first light reflection layer 51.

The first light reflection layer 51 as the first region is formed such that the particulate fillers P covered with the thin film-shaped translucent resin RE aggregates. The second light reflection layer 52 is formed such that the particulate fillers P are dispersed in the translucent resin RE. The second light reflection layer 52 is constituted of a low concentration layer 52A as a third region disposed on the lower side (the upper surface side of the substrate 11) and a transition layer 52B as a second region disposed along an upper boundary surface BS. In other words, in the first light reflection layer 51, the particulate fillers P covered with the thin film-shaped translucent resin RE is in an aggregated state.

The boundary surface BS that is an upper surface of the transition layer 52B (the upper surface of the second light reflection layer 52) is formed so as to extend from the end of the upper surface 30T of the wavelength converter 30 to the end of the upper surface of the frame body 13 and have a concave surface shape. The first light reflection layer 51 is formed so as to have the upper surface 50T that evens out the concave surface shape of the boundary surface BS on the upper surface of the second light reflection layer 52. In other words, the first light reflection layer 51 has a downwardly projecting lower surface shape. In the concave surface shape of the boundary surface BS, the maximum depth of the concave portion is formed at approximately 50 µm to 100 µm from the upper surface 30T of the wavelength converter 30 and the upper surface of the frame body 13. That is, the first light reflection layer 51 is formed having a maximum thickness of approximately 50 µm to 100 µm. The upper surface 50T, which is the upper surface of the first light reflection layer 51, is preferably flat. Light leakage can be reduced because the upper surface 50T is flat, that is, the surface area is small. In the embodiment, surface roughness of the upper surface 50T of the first light reflection layer 51 is Ra<1.0 µm or less.

The second light reflection layer 52 is constituted of the low concentration layer 52A as the third region disposed on the upper surface side of the substrate 11, which is the lower side of the second light reflection layer 52, and the transition layer 52B as the second region disposed along the upper boundary surface BS.

The low concentration layer 52A as the third region is, for example, a white resin where the particulate fillers P are dispersed in the translucent resin RE at a predetermined concentration. For example, the low concentration layer 52A includes the particulate fillers P dispersed in the translucent resin RE at a filler concentration of 20 to 60 wt % and is formed on the lower side of the second light reflection layer 52.

The transition layer 52B as the second region is formed in a vicinity of the boundary surface BS of the second light reflection layer 52 such that the filler concentration gradually increases from the filler concentration of the low concentration layer 52A toward the boundary surface BS. In other words, the content rate of the particulate fillers P of the second light reflection layer 52 gradually increases upward.

That is, in order from the upper surface side, the light reflecting portion 50 is formed of the first light reflection layer 51 as the first region that extends along the upper surface and is formed such that the particulate fillers P aggregate, the transition layer 52B as the second region that is disposed in the layer under the first light reflection layer 51 and is formed such that the filler concentration gradually increases toward the boundary surface BS with the first light reflection layer 51, and the low concentration layer 52A as the third region that is disposed in the layer under the transition layer 52B and has the filler concentration lower than that of the transition layer 52B. In other words, the light reflecting portion 50 includes the first light reflection layer 51 as the first region extending along the upper surface of the light reflecting portion 50, the transition layer 52B as the second region that is disposed under the first light reflection layer 51 and has the content rate of the particulate fillers P lower than that of the first light reflection layer 51, and the low concentration layer 52A as the third region that is disposed under the transition layer 52B and has the content rate of the particulate fillers P lower than that of the transition layer 52B.

In a manufacturing method described later, a raw material resin that includes a precursor of the liquid translucent resin RE where the particulate fillers P are dispersed is filled in the cavity formed of the substrate 11 and the frame body 13. At this time, the raw material resin crawls up to a side surface upper end (an upper surface end portion) of the wavelength converter 30 and to an inner-side-surface upper end (an upper surface end portion) of the frame body 13 by a surface tension and forms an upper surface having a shape similar to the boundary surface BS by meniscus.

After filling the raw material resin, spraying only the particulate fillers P from above before heating and curing the raw material resin forms a deposited portion where the particulate fillers P are deposited on an upper surface of the raw material resin. The precursor of the translucent resin RE contained in the raw material resin is drawn into the deposited portion due to occurrence of capillarity by the surface tension. The precursor drawn into the deposited portion is impregnated between the respective particles of the particulate fillers P in the deposited portion. As a result, the particulate fillers P in the deposited portion are covered with the precursor of the thin film-shaped translucent resin RE. The particulate fillers P sprayed at this time are identical to the particulate fillers P included in the raw material resin and are, for example, the TiO$_2$ particles having the particle size distribution with the average particle diameter of 0.25 µm.

During impregnation of the precursor of the translucent resin RE in the raw material resin, in the vicinity of the boundary surface BS of the raw material resin, the precursor moves while being impregnated into the deposited portion. At this time, in association with movement of the precursor, the particulate fillers P also move toward the boundary surface BS. However, the particulate fillers P are not impregnated into the deposited portion. Consequently, in a movement region of the precursor in the raw material resin, the particulate fillers P in the raw material resin gather in the vicinity of an upper surface (corresponding to the position of the boundary surface BS) of the raw material resin, and the closer the particulate fillers P are to the upper surface of the raw material resin, the more the particulate fillers P gather. In the movement region of the precursor in the raw material resin, this forms a region where the concentration of the particulate fillers P gradually increases along the boundary surface BS and upward.

Heating the raw material resin in this state thermally cures the precursor to be formed into the translucent resin RE. This forms the raw material resin into the second light reflection layer 52 that includes the low concentration layer 52A that has the particulate fillers P dispersed in the translucent resin RE at a predetermined concentration and the transition layer 52B that is formed along the boundary surface BS and is formed such that the filler concentration gradually increases upward. The deposited portion is formed into the first light reflection layer 51 formed such that the particulate fillers P covered with the thin film-shaped translucent resin RE aggregate. In the transition layer 52B, in the light-emitting device 10 during operation, it is preferred to adjust the filler concentration of the raw material resin so as to become the concentration where no crack is generated operationally.

As described above, the first light reflection layer 51 is the one where the precursor of the translucent resin RE in the raw material resin has been impregnated into the deposited portion. Thus, the translucent resin RE of the first light reflection layer 51 and the second light reflection layer 52 after heating and curing is the one that is continuously and integrally formed. That is, the boundary surface BS is not a bonding interface (for example, an interface where a cross-linked structure of silicone resin is interrupted) of the translucent resin RE, but a concentration boundary surface where a concentration difference of the particulate fillers P appears.

As described above, the first light reflection layer 51 is the one where the particulate fillers P covered with the thin film-shaped translucent resin RE has aggregated. That is, the first light reflection layer 51 is a layer having a remarkably high filler concentration. Thus, the first light reflection layer 51 is a layer having a remarkably high refractive index.

As a result, for example, the light such as LM1 that enters the second light reflection layer 52 from the side surface of the wavelength converter 30 is reflected or scattered downward at the boundary surface BS by the aggregated particulate fillers P of the first light reflection layer 51. For example, the light such as LM2 that enters the first light reflection layer 51 from the second light reflection layer 52 and reaches the upper surface 50T of the first light reflection layer 51 is totally reflected at the upper surface 50T of the first light reflection layer 51, which is the interface, by a refractive index difference between the first light reflection layer 51 and the air outside the light-emitting device 10.

The refractive index difference between the first light reflection layer 51 and the air outside the light-emitting device 10 is $\Delta n>0.5$ or more, more preferably $\Delta n>1.0$ or more. According to validation of the inventors, it has been confirmed that the sufficient light leakage reduction performance is achieved by setting the filler concentration of the first light reflection layer 51 to 70 wt % or more. Specifically, the result that, at a point 0.2 mm outside from the upper surface 30T of the wavelength converter 30, the light-emitting device 10 of the embodiment reduces the relative luminance of the leaked light by approximately 75% compared with a light-emitting device where the first light reflection layer 51 and the transition layer 52B are not formed, which is a conventional product, has been obtained. In other words, the content rate of the particulate fillers P in the first light reflection layer 51 is 70 wt % or more. The first light reflection layer 51 has the refractive index difference from the air of 0.5 or more.

Accordingly, the light-emitting device 10, in the light reflecting portion 50, has the first light reflection layer 51, which extends over the upper surface, having the filler concentration of 70 wt % or more and the refractive index difference from the air of $\Delta n>0.5$ or more. This allows the light-emitting device 10 to reduce the light leakage, which is unintended part, from the upper surface 50T of the light reflecting portion 50. In other words, the light reflecting portion 50 can enhance a light shielding property of the light reflecting portion 50 and can make it difficult for the light to leak to the outside of the light-emitting device 10 from the upper surface 50T of the light reflecting portion 50 because the light scattering particulate fillers P are in an aggregated state in the first light reflection layer 51.

In the second light reflection layer 52, the transition layer 52B having the filler concentration that gradually increases toward the boundary surface BS is formed. Consequently, in the transition layer 52B, the refractive index gradually increases toward the boundary surface BS. That is, the refractive index difference between the first light reflection layer 51 and the second light reflection layer 52 at the boundary surface BS is smaller than the refractive index difference between the first light reflection layer 51 and the air. In addition, the translucent resin RE of the first light reflection layer 51 and the second light reflection layer 52 is continuously and integrally formed.

As a result, like LM2, the light entering the first light reflection layer 51 is not multiply reflected between the upper surface 50T in the first light reflection layer 51 and the boundary surface BS and easily re-enters the second light reflection layer 52 again as the return light.

The light of LM1 reflected at the boundary surface BS and the light of LM2 that re-enters the second light reflection layer 52 from the first light reflection layer 51 as the return light are more likely to enter the wavelength converter 30 again. Since the light entering from the side surface of the wavelength converter 30 again is emitted from the upper surface 30T of the wavelength converter 30, it is possible to improve a luminous efficiency of the light-emitting device 10.

In the light-emitting device 10, the transition layer 52B having the filler concentration that gradually increases toward the boundary surface BS is formed. This allows the light-emitting device 10 to reduce the light leakage, which is unintended part, from the upper surface 50T of the light reflecting portion 50 and improve the luminous efficiency.

Usually, increasing the filler concentration of the particulate fillers P contained in the translucent resin RE causes the poor fluidity of the raw material resin and a problem, for example, such as unfilling in which the raw material resin does not spread throughout the cavity, causing insufficient filling into the cavity and generation of the empty holes.

In the embodiment, after the raw material resin with the filler concentration having sufficient fluidity is filled into the cavity, the light reflecting portion 50 is formed by spraying the particulate fillers P onto the upper surface of the raw material resin. Consequently, at manufacturing of the light-emitting device 10, the problem such as unfilling of the raw material resin into the cavity does not occur, even when the first light reflection layer 51 having the high filler concentration is formed. Therefore, the light-emitting device 10 ensures ease of manufacturing.

Increasing the filler concentration of the particulate fillers P contained in the translucent resin RE is likely to cause occurrence of reliability failures such as a crack in the light reflecting portion 50 due to a temperature change by heat generation or the like of the light-emitting element 20 or a physical impact when the light-emitting device 10 is repeatedly driven.

In the embodiment, the filler concentration of the raw material resin is adjusted so as to become the concentration where operationally the crack is not generated, especially, in the transition layer 52B. Accordingly, even if the crack is generated in the first light reflection layer 51, the light reflecting portion 50 can suppress the crack from extending into the second light reflection layer 52. The second light reflection layer 52 is formed so as to cover the side surface of the wavelength converter 30. Accordingly, even if the crack is generated in the first light reflection layer 51, the light reflecting portion 50 can suppress the crack from extending up to the interface between the side surface of the wavelength converter 30 and second light reflection layer 52. Accordingly, the light reflecting portion 50 can suppress an occurrence of debonding or the like between the side surface of the wavelength converter 30 and the light reflecting portion 50. Consequently, the light reflecting portion 50 can reduce color unevenness, uneven luminescence, and the like of the light-emitting device 10 caused by the light leakage due to the crack in a circumference of the wavelength converter 30. Therefore, according to the light-emitting device 10, it is possible to ensure the reliability of the light-emitting device.

According to the embodiment, the light-emitting device 10 can provide a light-emitting device and its manufacturing method that, while ensuring the ease of manufacturing and the reliability, can reduce the light leakage from the unintended portion.

Next, using FIGS. 4 to 12, one example of a manufacturing procedure of the light-emitting device 10 will be described.

Figure 4:
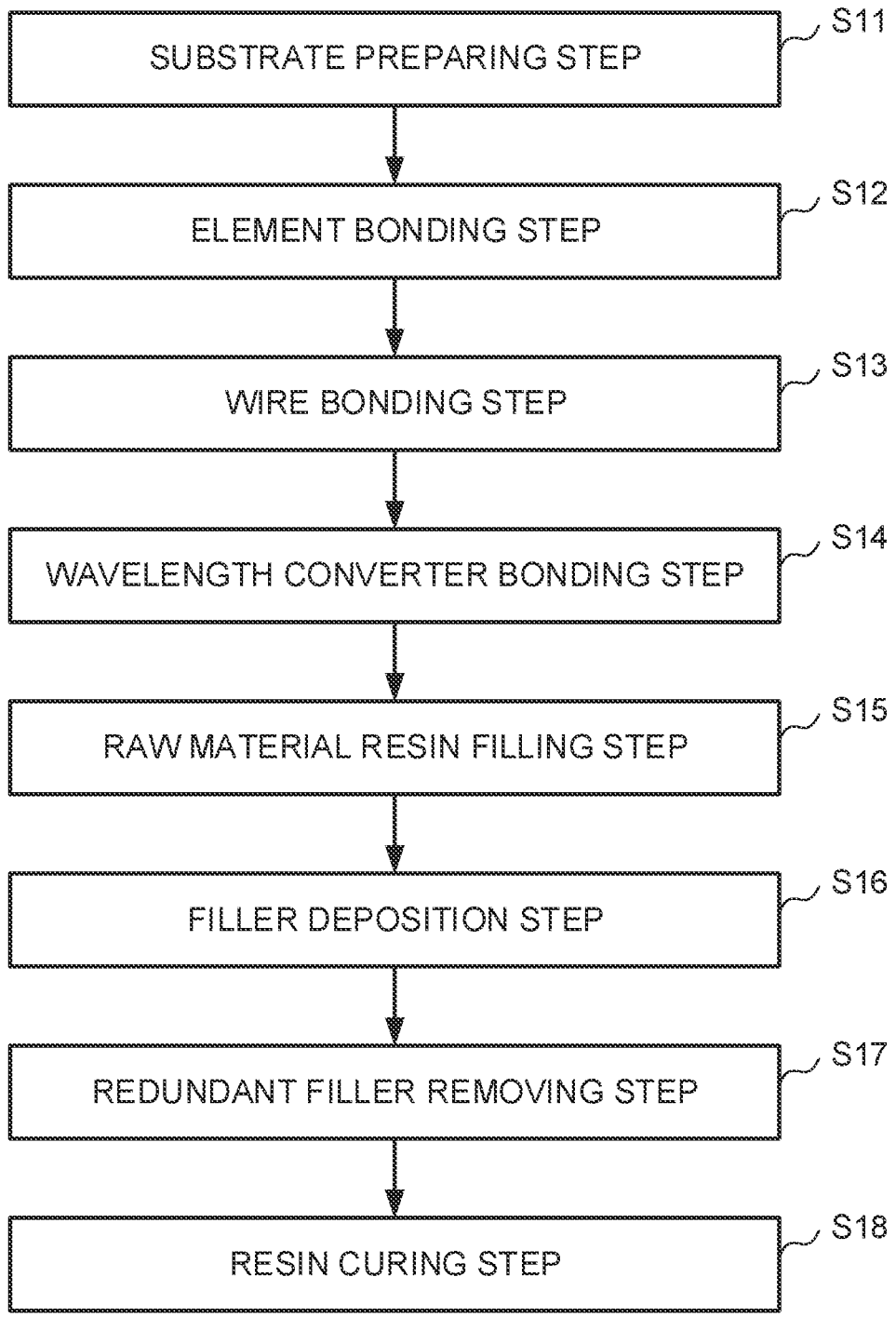
FIG. 4 is a diagram illustrating a manufacturing flow of the light-emitting device according to the embodiment of the present invention.

FIG. 4 is a diagram illustrating a manufacturing flow of the light-emitting device 10 according to the embodiment of the present invention. FIGS. 5 to 12 illustrate cross-sectional views of the light-emitting device 10 at each step of the manufacturing procedure illustrated in FIG. 4. In FIGS. 5 to 12, cross-sectional views taken along a line CS1-CS1 of the light-emitting device 10 in FIG. 1 are illustrated.

Figure 5:
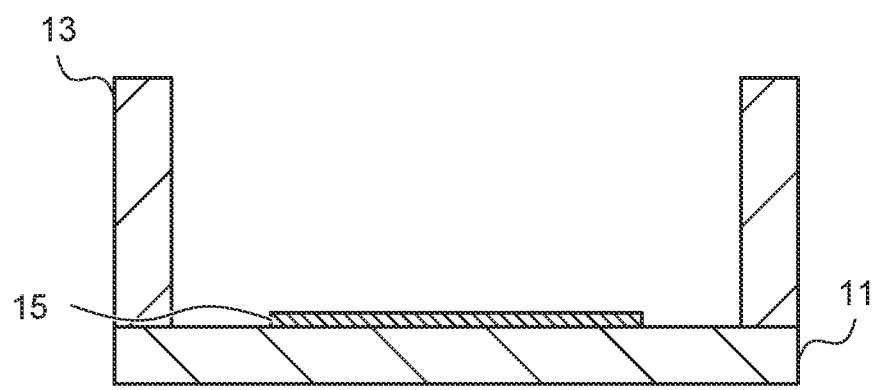
FIG. 5 is a cross-sectional view in manufacturing the light-emitting device according to the embodiment of the present invention.

First, as illustrated in FIG. 5, a substrate preparing step of preparing the substrate 11 that includes the annular frame body 13 disposed on the upper surface of the substrate 11 is performed (Step S11). In the substrate 11, the first wiring electrode 15 and the second wiring electrode 17 are preliminarily formed. The frame body 13 is disposed at the outer peripheral portion of the upper surface of the substrate 11 and disposed so as to surround the first wiring electrode 15 and the second wiring electrode 17. The frame body 13 may be bonded on the upper surface of the substrate 11 using an adhesive such as a resin, or the substrate 11 and the frame body 13 may be integrally formed. In other words, the manufacturing method of the light-emitting device 10 includes the substrate preparing step of preparing the substrate 11 that includes the frame body 13 disposed on the upper surface of the substrate 11 and extending upward along the periphery of the substrate 11.

Figure 6:
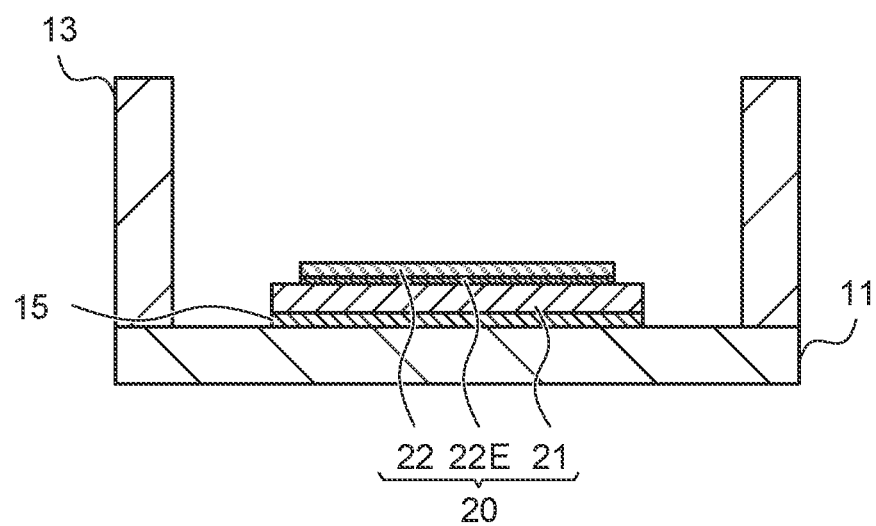
FIG. 6 is a cross-sectional view in manufacturing the light-emitting device according to the embodiment of the present invention.

Next, as illustrated in FIG. 6, an element bonding step of bonding the light-emitting element 20 on the first wiring electrode 15 is performed (Step S12). The light-emitting element 20 is bonded with the first wiring electrode 15 via a conductive adhesive (not illustrated) or the like. For example, an AuSn paste is applied on the upper surface of the first wiring electrode 15 by using a dispenser filled with the AuSn paste. On the applied AuSn paste, the light-emitting element 20 is mounted on the first wiring electrode 15 such that the cathode electrode (not illustrated) disposed on the lower surface of the light-emitting element 20 and the AuSn paste are brought into contact with one another.

By heating the substrate 11 in this state, for example, up to 300° C. in a nitrogen atmosphere to cause the AuSn alloy particles in the AuSn paste to be melted and then cooling the substrate 11, the light-emitting element 20 and the first wiring electrode 15 are fixed to one another. The light-emitting element 20 and the first wiring electrode 15 are eutectically bonded to one another by the AuSn alloy and are electrically connected to one another. In other words, the manufacturing method of the light-emitting device 10 includes the element bonding step of bonding the light-emitting element 20 having the support substrate 21 and the semiconductor layer 22 formed on the upper surface of the support substrate 21 onto the substrate 11.

The position and the orientation where the light-emitting element 20 is fixed is self-aligned by a surface tension of the molten AuSn alloy. Specifically, between the heated and molten AuSn alloy and the light-emitting element 20, the light-emitting element 20 is self-aligned by the surface tension where an interfacial energy of the molten AuSn alloy becomes a minimum.

The bonding between the light-emitting element 20 and the first wiring electrode 15 is not limited to this, a conductive adhesive made from an AuSn bump containing no flux, an AuSn sheet, or an AuSn deposition layer preliminarily formed on the lower surface of the light-emitting elements 20 as a raw material may be used. For the bonding between the light-emitting element 20 and the first wiring electrode 15, a conductive adhesive, such as a silver paste or solder, may be used.

Next, as illustrated in FIG. 1, the electrode pad 23 of the light-emitting element 20 and the second wiring electrode 17 are connected by respective bonding wires BW (Step S13). The substrate 11 with the bonded light-emitting element 20 is set in a wire bonding machine, and the bonding wires BW, such as an Au wire, are bonded to the electrode pad 23 and the second wiring electrode 17. This electrically connects the anode electrode of the light-emitting element 20 to the second wiring electrode 17 via the electrode pad 23 and the bonding wires BW.

Figure 7:
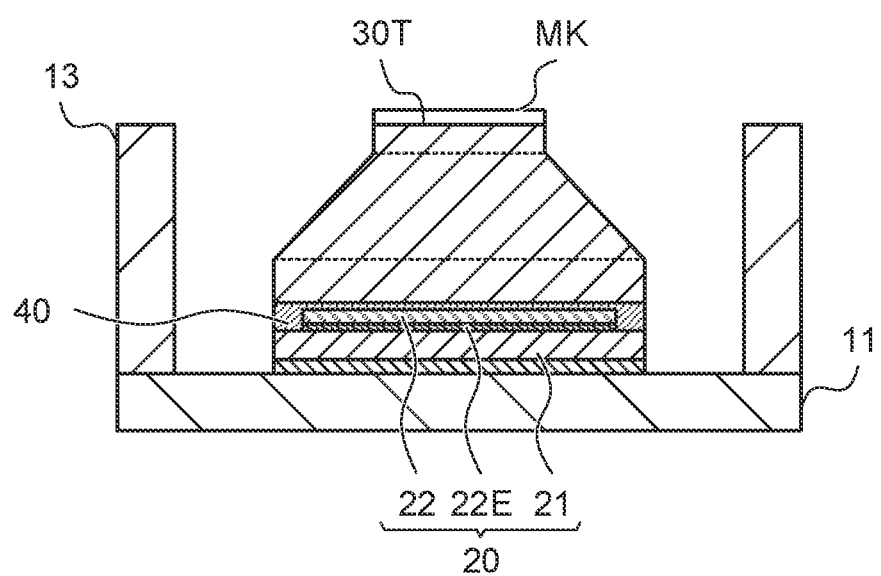
FIG. 7 is a cross-sectional view in manufacturing the light-emitting device according to the embodiment of the present invention.

Next, as illustrated in FIG. 7, a wavelength convertor bonding step of bonding the wavelength converter 30 on the semiconductor layer 22 of the light-emitting element 20 via the adhesive resin 40 is performed (Step S14). A raw material of the adhesive resin 40 is applied on the semiconductor layer 22 of the light-emitting element 20 by using a dispenser filled with the raw material of the adhesive resin 40. Subsequently, the wavelength converter 30 is mounted on the semiconductor layer 22 such that the raw material of the adhesive resin 40 and the lower surface of the wavelength converter 30 are brought into contact with one another. A mounting position of the wavelength converter 30 is aligned to a position that covers the semiconductor layer 22. A mask MK is preliminarily provided on the upper surface 30T of the wavelength converter 30. Heating the substrate 11 in this state causes the raw material of the adhesive resin 40 to be cured to bond the light-emitting element 20 and the wavelength converter 30 to one another. In other words, the manufacturing method of the light-emitting device 10 includes the wavelength convertor bonding step of bonding the wavelength converter 30 on the upper surface of the light-emitting element 20.

Figure 8:
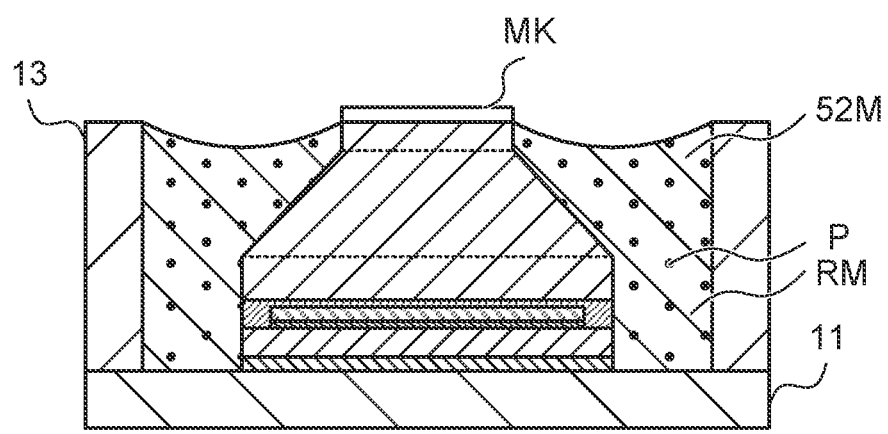
FIG. 8 is a cross-sectional view in manufacturing the light-emitting device according to the embodiment of the present invention.

Next, as illustrated in FIG. 8, a raw material resin filling step of filling a raw material resin 52M as a light reflective resin raw material that is a raw material of the second light reflection layer 52 in the cavity formed of the substrate 11 and the frame body 13 is performed (Step S15). The raw material resin 52M is made from a precursor RM of the translucent resin RE as a liquid translucent resin precursor with the particulate fillers P being dispersed. In the raw material resin 52M, the particulate fillers P are dispersed at a content rate that becomes a predetermined filler concentration of the low concentration layer 52A after curing. The raw material resin 52M is injected into the cavity formed of the substrate 11 and the frame body 13 by using a dispenser filled with the raw material resin 52M and is filled so as to cover the side surfaces of the light-emitting element 20 and the wavelength converter 30. In other words, the manufacturing method of the light-emitting device 10 includes the raw material resin filling step of injecting and filling the raw material resin 52M made of the precursor RM of the translucent resin RE containing the light reflective particulate fillers P into the frame body 13 so as to cover the side surfaces of the light-emitting element 20 and the wavelength converter 30.

When filled, the raw material resin 52M crawls up to the side surface upper end of the wavelength converter 30 and the frame body 13 by the surface tension and forms the meniscus having a concave surface shape. A filling amount of the raw material resin 52M is adjusted such that a maximum depth of the concave surface becomes approximately 50 μm to 100 μm from the upper surface 30T of the wavelength converter 30 and the upper surface of the frame body 13. In this step, heating and curing of the raw material resin 52M is not performed.

Figure 9:
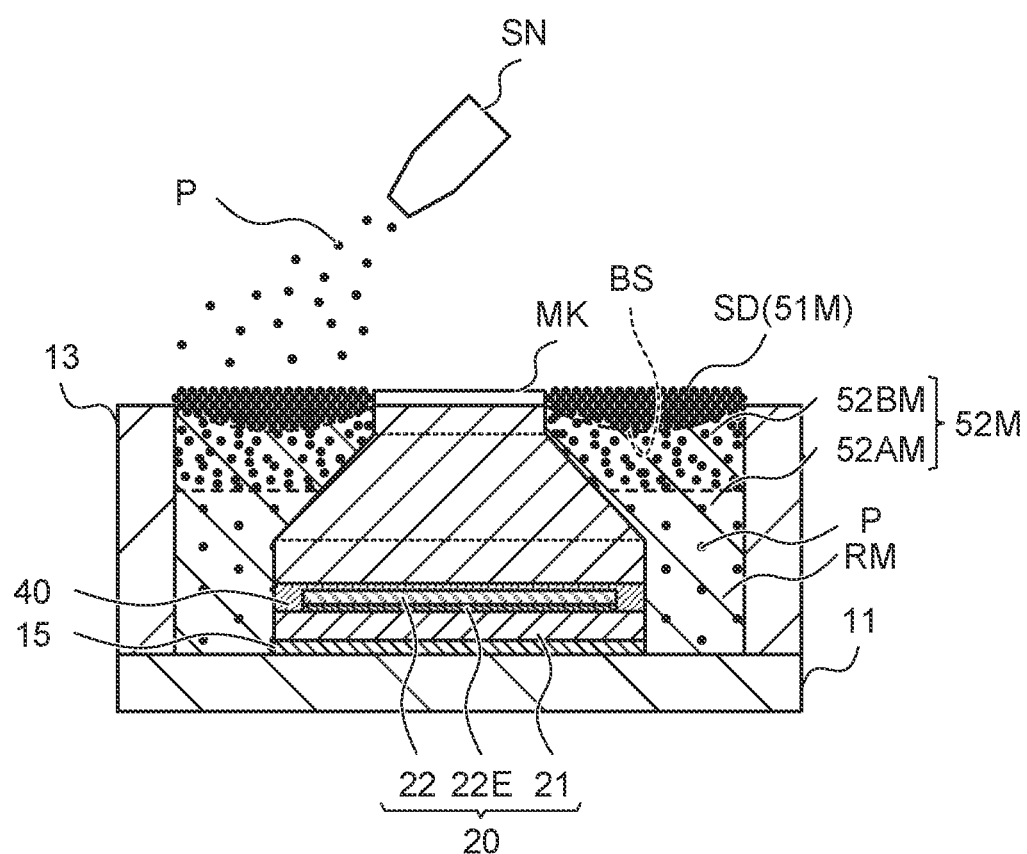
FIG. 9 is a cross-sectional view in manufacturing the light-emitting device according to the embodiment of the present invention.

Next, as illustrated in FIG. 9, a filler deposition step of spraying the particulate fillers P that is particulate bodies on the raw material resin 52M from above to form an aggregate layer 51M that is a raw material of the first light reflection layer 51 is performed (Step S16). For example, a filler deposited portion SD is formed by a method of spraying the particulate fillers P. Specifically, the filler deposited portion SD is formed by spraying air (air), nitrogen, or the like where the particulate fillers P are dispersed from a spray nozzle SN located above the raw material resin 52M. The particulate fillers P sprayed at this time is the one identical to the particulate fillers P contained in the raw material resin 52M. In other words, the manufacturing method of the light-emitting device 10 includes the filler deposition step of spraying the particulate bodies made of a material identical to a material of the particulate fillers P from above the raw material resin 52M to deposit the particulate fillers P on the raw material resin 52M. In the filler deposition step, the particulate fillers P are applied by spray application from above the raw material resin 52M to deposit the particulate fillers P.

Figure 10:
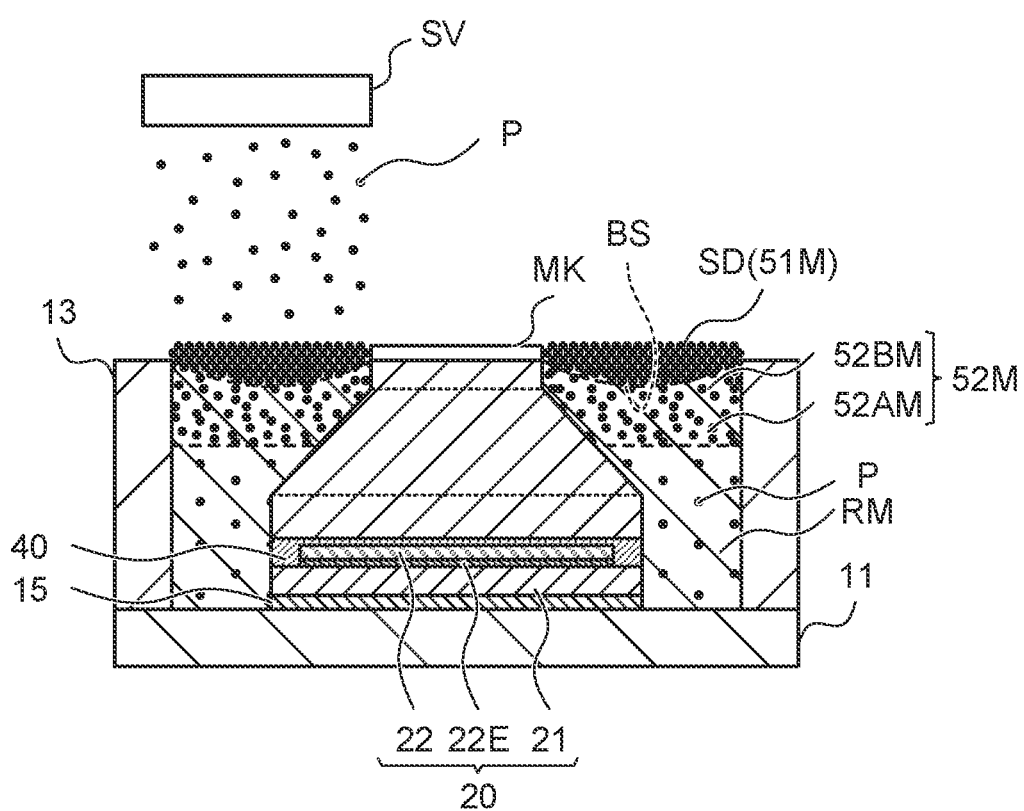
FIG. 10 is a cross-sectional view in manufacturing the light-emitting device according to the embodiment of the present invention.

As illustrated in FIG. 10, the filler deposited portion SD may be formed by spraying the particulate fillers P on the raw material resin 52M using a sieve SV from above. By using the sieve SV, problems such as scattering of the raw material resin 52M or change of the surface shape can be reduced. In other words, in the filler deposition step, the particulate fillers P are deposited by spraying the particulate fillers P using a sieve SV from above the raw material resin 52M.

After the filler deposited portion SD is formed as described above, the substrate 11 is left stationarily for approximately five minutes, and the precursor RM of the translucent resin RE in the raw material resin 52M is impregnated into the filler deposited portion SD. As a result, in the filler deposited portion SD, the aggregate layer 51M that has the particulate fillers P covered with the thin film-shaped precursor RM and becomes a raw material of the first light reflection layer 51 is formed. As a result, the precursor RM is integrated over the raw material resin 52M and the aggregate layer 51M, and the concave surface of the raw material resin 52M becomes the boundary surface BS that is a concentration surface where a concentration difference of the particulate fillers P appears.

As described above, by stationarily leaving the substrate 11 where the filler deposited portion SD is formed for approximately five minutes, the precursor RM of the translucent resin RE is impregnated into the filler deposited portion SD from the raw material resin 52M. In the raw material resin 52M, this forms a low concentration raw material layer 52AM that becomes the filler concentration of the low concentration layer 52A and a transition raw material layer 52BM that becomes the transition layer 52B where the filler concentration gradually increases along the boundary surface BS and upward. In this step, heating and curing of the raw material resin 52M is not performed. In other words, in the filler deposition step, the precursor RM of the translucent resin RE is impregnated between the deposited particulate fillers P.

Figure 11:
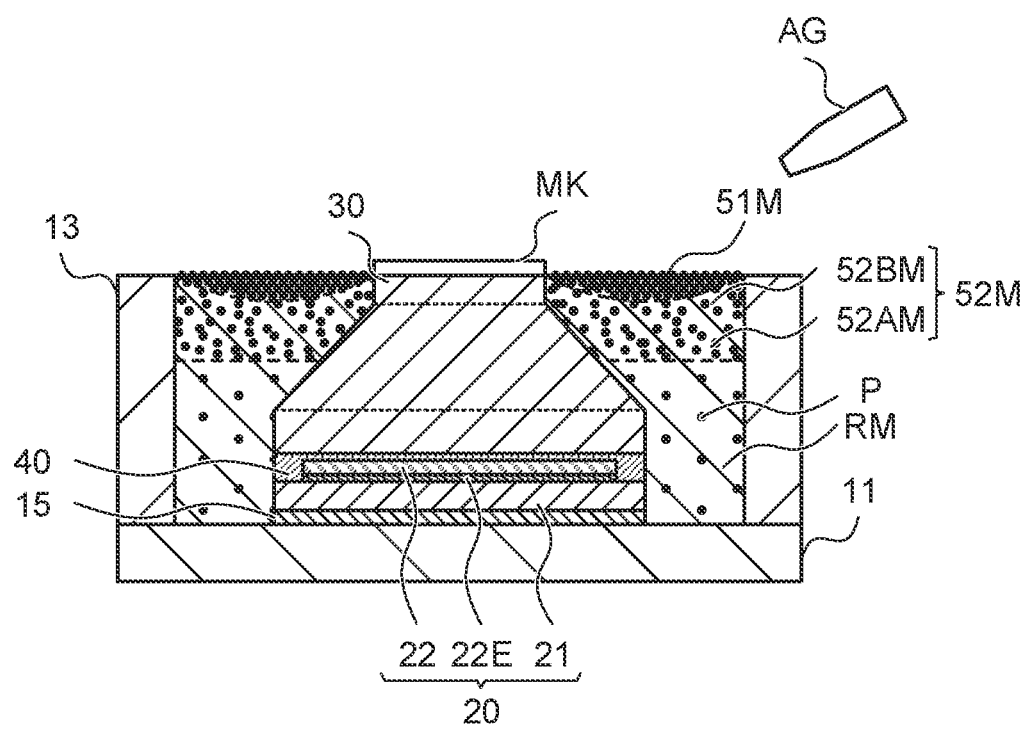
FIG. 11 is a cross-sectional view in manufacturing the light-emitting device according to the embodiment of the present invention.

Next, as illustrated in FIG. 11, in the aggregate layer 51M, a redundant filler removing step of removing the redundant particulate fillers P in a portion into which the precursor RM is not impregnated is performed (Step S17). For example, by spraying a fluid of air or the like with an air gun AG or the like from above or a side direction of the substrate 11, the redundant particulate fillers P in the portion into which the precursor RM is not impregnated in the aggregate layer 51M is removed. In other words, the manufacturing method of the light-emitting device 10 includes the redundant filler removing step of partially removing the particulate fillers P on the surface by spraying a fluid to the particulate fillers P in the deposited aggregate layer 51M.

This removes the redundant particulate fillers P that is not covered with the precursor RM, of the filler deposited portion SD. That is, in the filler deposited portion SD, only the aggregate layer 51M, which becomes a raw material of the first light reflection layer 51, where the particulate fillers P are covered with the thin film-shaped precursor RM remains on the raw material resin 52M.

Figure 12:
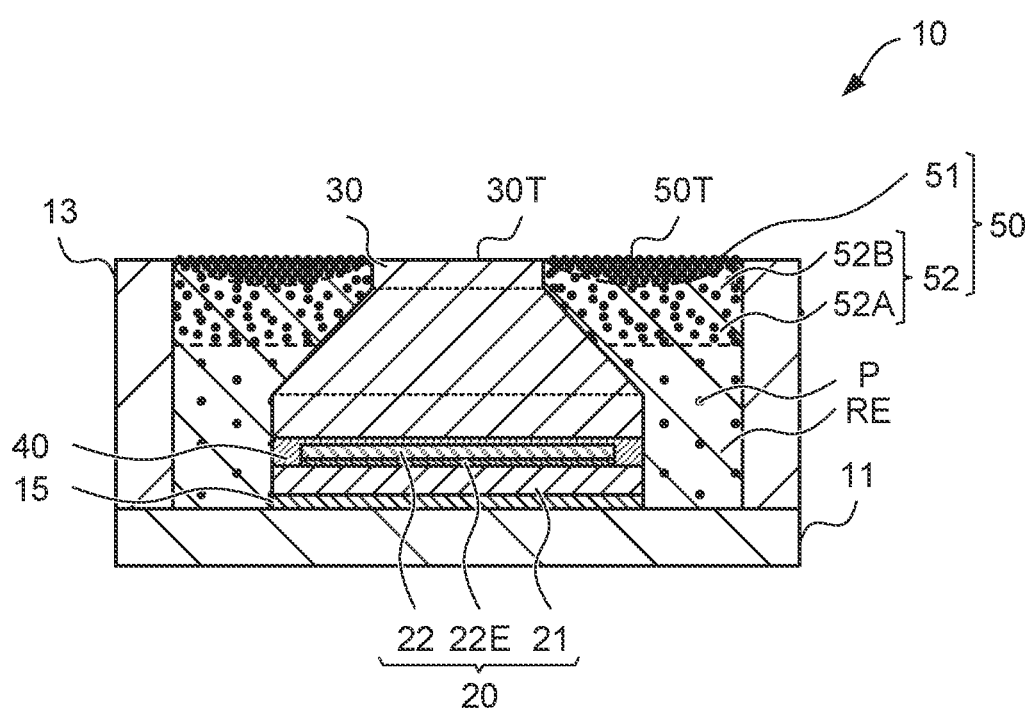
FIG. 12 is a cross-sectional view in manufacturing the light-emitting device according to the embodiment of the present invention.

Next, as illustrated in FIG. 12, a resin curing step of heating the substrate 11 where the redundant particulate fillers P in the aggregate layer 51M is removed and curing the precursor RM is performed (Step S18). By heating, the precursor RM becomes the translucent resin RE. As a result, the low concentration raw material layer 52AM becomes the low concentration layer 52A and the transition raw material layer 52BM becomes the transition layer 52B, and thus the second light reflection layer 52 is formed. The aggregate layer 51M is formed as the first light reflection layer 51. In other words, the manufacturing method of the light-emitting device 10 includes the resin curing step of curing the precursor RM of the translucent resin RE. After heating and curing the precursor RM, the mask MK of the wavelength converter 30 is removed and the upper surface 30T of the wavelength converter 30 is exposed.

By processing the steps of Step S11 to Step S18 described above, the light-emitting device 10 is manufactured.

According to the embodiment, the light-emitting device 10 has the light reflecting portion 50 formed so as to cover the side surfaces of the light-emitting element 20 and the wavelength converter 30, in the cavity formed of the substrate 11 and the frame body 13. The light reflecting portion 50 has the first light reflection layer 51 having the content rate of the particulate fillers P, which extend over the upper surface, of 70 wt % or more, which is a high filler concentration, and the lower surface (the boundary surface BS) having a downwardly projecting shape. The light reflecting portion 50 has the second light reflection layer 52 that is disposed under the lower surface of the first light reflection layer 51 and has the translucent resin RE integrally formed with the first light reflection layer 51. The second light reflection layer 52 has the transition layer 52B in the vicinity of the boundary surface BS having the content rate of the particulate fillers P that gradually increases toward the boundary surface BS and the low concentration layer 52A that is disposed under the transition layer 52B and has the content rate of the particulate fillers P lower than the first light reflection layer 51 and the transition layer 52B.

By having these structures, the light having entered the second light reflection layer 52 from the side surface of the wavelength converter 30 is reflected or scattered in a downward direction by the aggregated particulate fillers P in the first light reflection layer 51. The light having entered the first light reflection layer 51 from the transition layer 52B is totally reflected at the upper surface 50T that is the upper surface of the first light reflection layer 51 and is the interface with the air outside the first light reflection layer 51 and the light-emitting device 10. In the boundary surface BS, the refractive index difference between the first light reflection layer 51 and the transition layer 52B is small, and the translucent resin RE is continuously formed. Consequently, the light having entered the first light reflection layer 51 is not multiply reflected inside the first light reflection layer 51 and easily re-enter the second light reflection layer 52 (the transition layer 52B). The light having re-entered the second light reflection layer 52 from the first light reflection layer 51 is likely to re-enter the wavelength converter 30.

According to the embodiment, in the manufacturing method of the light-emitting device 10, the raw material resin 52M where the particulate fillers P are dispersed at a predetermined content rate is filled into the cavity. The raw material resin 52M is filled such that the filled raw material resin 52M has a concave upper surface shape by the surface tension. The particulate fillers P are sprayed from above the raw material resin 52M to form the filler deposited portion SD. In the filler deposited portion SD, the precursor RM of the translucent resin RE contained in the raw material resin 52M is impregnated into the filler deposited portion SD. Heating the substrate 11 to cure the precursor RM forms the first light reflection layer 51 having the high content rate of the particulate fillers P, the transition layer 52B that is disposed under the first light reflection layer 51 and has the filler content rate gradually increasing upward, and the low concentration layer 52A disposed under the transition layer 52B.

According to the embodiment, when the light-emitting device 10 is repeatedly driven, even if the crack is generated in the first light reflection layer 51, it is possible to suppress the crack from extending downward (the second light reflection layer 52) with respect to the boundary surface BS.

Having these structures and features allows the light-emitting device 10 to provide a light-emitting device and its manufacturing method that can reduce the light leakage from an unintended portion while ensuring the ease of manufacturing and the reliability.

[Modification]

In the embodiment, while a case where one light-emitting element 20 is disposed on the substrate 11 is described, a plurality of light-emitting elements 20 may be disposed on the substrate 11.

Figure 13:
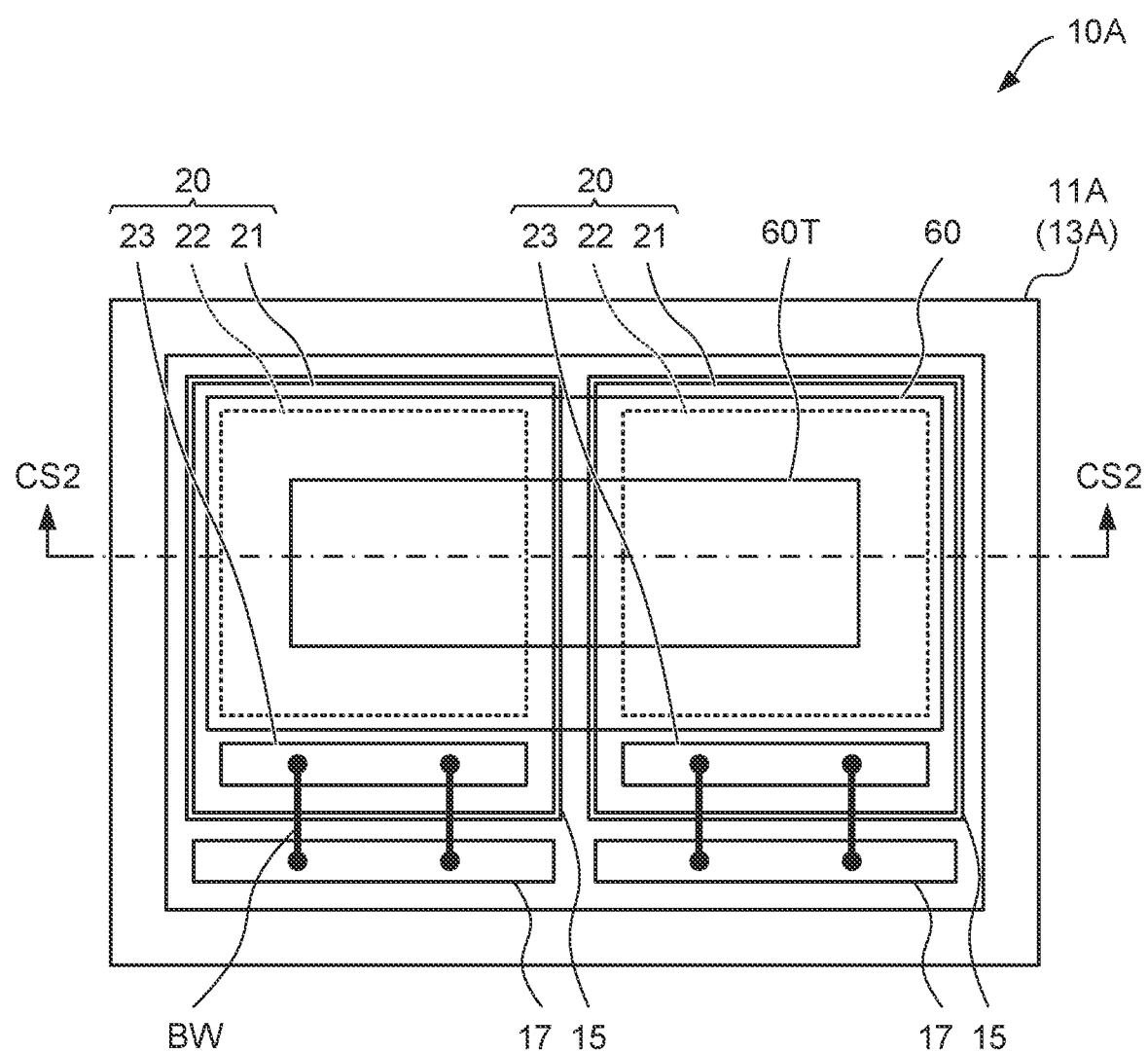
FIG. 13 is a top view of a light-emitting device according to a modification of the present invention.
Figure 14:
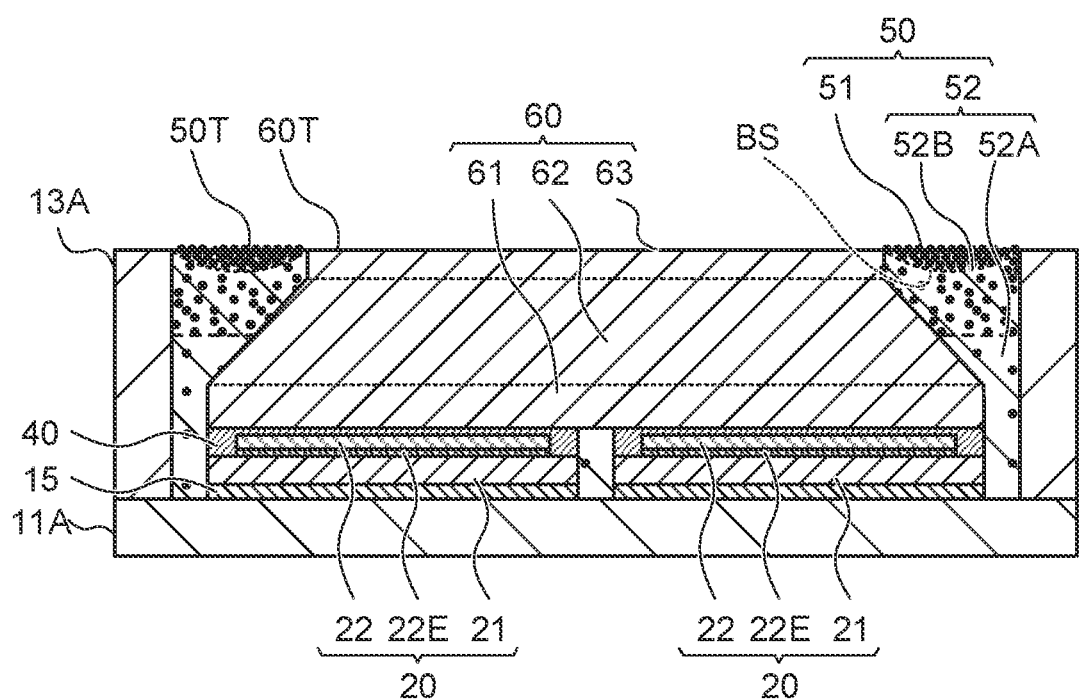
FIG. 14 is a cross-sectional view of the light-emitting device according to the modification of the present invention.

FIG. 13 is a top view of a light-emitting device 10A according to the modification of the embodiment. FIG. 14 is a cross-sectional view taken along a line CS2-CS2 of the light-emitting device 10A illustrated in FIG. 13. In FIG. 13, illustration of the light reflecting portion 50 is omitted in order to illustrate a structure of an inside of the light reflecting portion 50 of the light-emitting device 10A.

The light-emitting device 10A basically has a structure similar to that of the light-emitting device 10 of the embodiment. The light-emitting device 10A is different from the light-emitting device 10 in that a plurality of light-emitting elements 20 are arranged in one direction on a substrate 11A while the light-emitting device 10A has a wavelength converter 60 integrally formed over on each upper surface of the semiconductor layers 22 of the plurality of light-emitting elements 20 arranged as described above.

The wavelength converter 60 of the modification is formed such that a bottom surface and an upper surface 60T, which is a light extraction surface, each have a rectangular shape. That is, the bottom surface of the wavelength converter 60 is disposed so as to extend over the respective semiconductor layers 22 of the plurality of light-emitting elements 20 and cover the respective semiconductor layers 22.

The manufacturing method of the light-emitting device 10A of the modification is similar to that of the embodiment. As a result, as illustrated in FIG. 14, in the light reflecting portion 50, the first light reflection layer 51 extending over the upper surface 50T and having a downwardly projecting lower surface (the boundary surface BS) shape is formed. Under the first light reflection layer 51, the second light reflection layer 52 including the transition layer 52B in the vicinity of the boundary surface BS having the content rate of the particulate fillers P that gradually increases toward the boundary surface BS and the low concentration layer 52A that is disposed under the transition layer 52B and has the low content rate of the particulate fillers P is formed. A region between the opposed side surfaces of the light-emitting elements 20 is filled with the low concentration layer 52A.

Thus, the light reflecting portion 50 including the first light reflection layer 51, the low concentration layer 52A, and the transition layer 52B and its forming method is applicable to the case where a plurality of light-emitting elements 20 are mounted, and it is possible to reduce the light leakage from the unintended portion while ensuring the ease of manufacturing and reliability.

The manufacturing method of the light-emitting device according to the embodiment and the modification is merely one example and is not limited to the method described above. For example, in the filler deposition step at Step S16 indicated in FIG. 4, the filler deposited portion SD may be formed by arranging the light-emitting device in a closed space such as a furnace and then convecting and circulating nitrogen or the like where the particulate fillers P are dispersed in the closed space. It is only necessary that the particulate fillers P can be deposited on the upper surface of the raw material resin 52M before curing the raw material resin 52M.

In the embodiment and the modification, a case where the semiconductor layer 22 of the light-emitting element 20 is a blue LED the main material of which is the nitride semiconductor is described. However, the material of the semiconductor layer 22 is not limited to this, and semiconductor light-emitting layers of various LEDs and lasers that emit the light of other colors are applicable.

In the embodiment and the modification, the light-emitting device that includes the wavelength converter 30 or the wavelength converter 60 including the phosphor that is excited by the light emitted by each light-emitting element and performs the wavelength conversion of the emitted light is described. However, the wavelength converter may be a light projection plate that does not include the phosphor and does not perform the wavelength conversion of the light emitted by each light-emitting element.

When using the wavelength converter 30 that contains the phosphor performing the wavelength conversion, it is only necessary that, regarding the color of the emitted light of each light-emitting element and the color of the light for which the wavelength converter 30 performs the wavelength conversion, the material of each light-emitting element 20, the material of the phosphor contained in the wavelength converter 30, and the contained amount of the phosphor are appropriately selected such that the color of the light emitted from the light-emitting device 10 becomes the desired color.

In the embodiment and the modification, a case where, in the wavelength converter 30, the upper surface, which is the light extraction surface, is formed having a size smaller than that of the lower surface, which is the light incident surface, is described. However, the shape of the wavelength converter 30 is not limited to this, for example, the wavelength converter may have a rectangular cross-sectional shape. The light reflecting portion 50 indicated in the embodiment and the modification is applicable to a wavelength converter having any shape disposed above the light extraction surface of the light-emitting element 20.

It is understood that the foregoing description and accompanying drawings set forth the preferred embodiments of the present invention at the present time. Various modifications, additions and alternative designs will, of course, become apparent to those skilled in the art in light of the foregoing teachings without departing from the spirit and scope of the disclosed invention. Thus, it should be appreciated that the present invention is not limited to the disclosed Examples but may be practiced within the full scope of the appended claims. This application is based upon and claims the benefit of priority from the prior Japanese Patent Application No. 2021-25975 filed on Feb. 22, 2021, the entire contents of which are incorporated herein by reference.

What is claimed is:

1. A light-emitting device comprising:
    a substrate;
    a frame body disposed on an upper surface of the substrate, the frame body extending along a periphery of the substrate;
    a light-emitting element including a support substrate disposed on the substrate and a semiconductor light-emitting layer formed on an upper surface of the support substrate;
    a wavelength converter disposed on an upper surface of the light-emitting element; and
    a light reflecting portion covering side surfaces of the light-emitting element and the wavelength converter and being formed of a translucent resin containing light reflective particulate fillers, wherein
    the light reflecting portion includes a first region extending along an upper surface of the light reflecting portion, a second region that is disposed under the first region and has a content rate of the particulate fillers lower than a content rate of the first region, and a third region that is disposed under the second region and has a content rate of the particulate fillers lower than the content rate of the second region.

2. The light-emitting device according to claim 1, wherein the first region has an aggregated state of the particulate fillers covered with the translucent resin having a thin film-shape.

3. The light-emitting device according to claim 1, wherein the content rate of the particulate fillers in the second region gradually increases upward.

4. The light-emitting device according to claim 1, wherein the content rate of the particulate fillers in the first region is 70 wt % or more.

5. The light-emitting device according to claim 1, wherein the first region has a refractive index difference from air of 0.5 or more.

6. The light-emitting device according to claim 1, wherein the first region has an upper surface with a surface roughness of Ra<1.0 μm or less.

7. The light-emitting device according to claim 1, wherein the first region has a downwardly projecting lower surface shape.

8. The light-emitting device according to claim 1, wherein the particulate fillers are formed of titanium dioxide, and the translucent resin is formed of silicone resin.

9. The light-emitting device according to claim 1, wherein the wavelength converter has a bottom surface covering an entire upper surface of the semiconductor light-emitting layer and an upper surface smaller than the bottom surface, the wavelength converter having a side surface shape with a width in a direction parallel to the substrate, the width decreasing from the bottom surface toward the upper surface.

* * * * *